United States Patent [19]
Tanttu

[11] Patent Number: 5,262,724
[45] Date of Patent: Nov. 16, 1993

[54] EXAMINATION METHOD AND APPARATUS

[75] Inventor: Jukka Tanttu, Espoo, Finland

[73] Assignee: Instrumentarium Corp., Finland

[21] Appl. No.: 949,345

[22] Filed: Sep. 22, 1992

Related U.S. Application Data

[63] Continuation of Ser. No. 580,819, Sep. 11, 1990, abandoned.

[30] Foreign Application Priority Data

May 29, 1990 [FI] Finland .................................. 902660

[51] Int. Cl.⁵ .............................................. G01V 3/00
[52] U.S. Cl. ...................................... 324/309; 324/307
[58] Field of Search ............... 324/309, 307, 312, 306; 128/653.2, 653.3

[56] References Cited

U.S. PATENT DOCUMENTS 4,868,501  9/1989  Conolly ............................... 324/309
4,906,932  3/1990  Ordidge .............................. 324/309
4,983,920  1/1991  Lampman et al. .................. 324/309
5,057,776 10/1991  Macovski ........................... 324/309

OTHER PUBLICATIONS

S. D. Wolff, R. S. Balaban: *Magnetic Resonance in Medicine*, 10, pp. 135–144 (1989).
C. E. Spritzer, R. A. Blinder: *Magnetic Resonance Quarterly*, 5, pp. 205–227 (1989).

*Primary Examiner*—Louis Arana
*Attorney, Agent, or Firm*—Andrus, Sceales, Starke & Sawall

[57] ABSTRACT

The invention relates to a method for the examination of an object, such as a human body, an animal or the trunk of a tree, on the basis of NMR phenomenon and magnetic resonance imaging techniques, said method including a preparatory section and a signal pick-up section. Said preparatory section comprises the actions for producing a spin inversion and the actions for off-resonance radiation.

10 Claims, 4 Drawing Sheets

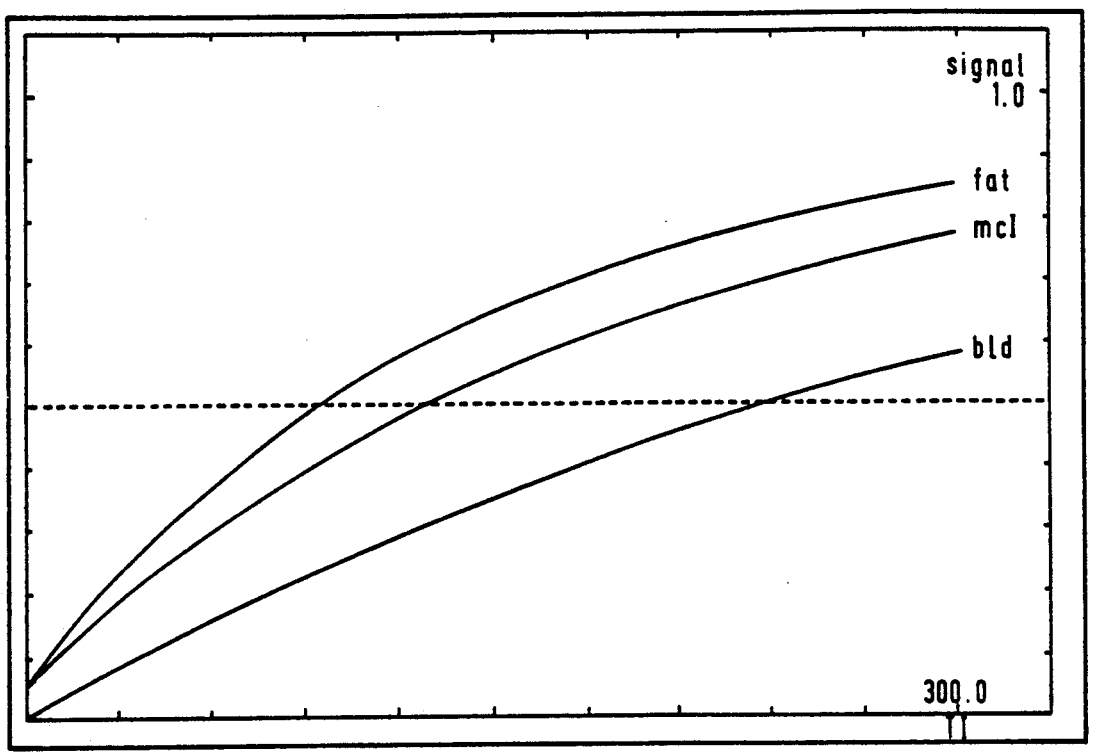
FIG. 5
FIG. 6
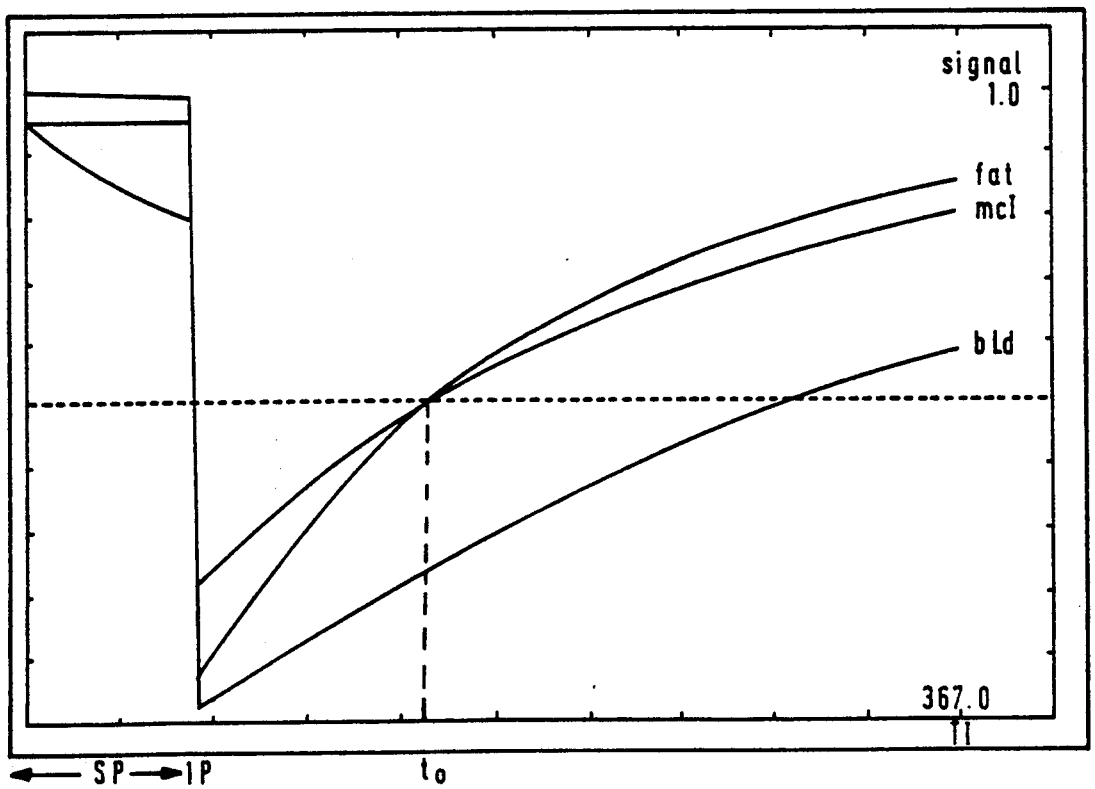

EXAMINATION METHOD AND APPARATUS

The present application is a continuation application of U.S. patent application Ser. No. 07/580,819, filed Sep. 11, 1990, and now abandoned.

The present invention relates to a method and apparatus based on magnetic resonance for the examination of e.g. a human body, foodstuffs or process industrial products or a process itself.

BACKGROUND OF THE INVENTION

Magnetic resonance imaging (MRI) is a technique that utilizes a nuclear magnetic resonance phenomenon (NMR) for finding out the local distributions of the nuclear density and nucleus-related NMR properites of an object or the physical and chemical properties having an effect thereon. Such NMR properties include e.g.: longitudinal relaxation (characterized by longitudinal relaxation time T1), transverse relaxation (characterized by transverse relaxation time T2), relaxation in spinning coordinates (characterized by relaxation time (T1rho), chemical shift, and coupling factors between nuclei. The physical phenomena having an effect on NMR properties include e.g.: flow rate, diffusion, paramagnetic materials, ferromagnetic materials, viscosity and temperature.

Magnetic resonance and magnetic resonance imaging methods and applications have been described in a number of references: Wehrli F. W., Shaw D., Kneeland B. J.: Biomedical Magnetic Resonance Imaging, VCH Publishers, Inc., New York 1988, Stark D. D. and Bradley W. G.: Magnetic resonance imaging, C. V. Mosby Comp., St. Louis 1988, Gadian D. G.: Nuclear magnetic resonance and its applications to living systems, Oxford Univ. Press, London 1982, Shaw D.: Fourier transform NMR spectroscopy, Elsevier, Amsterdam 1984, Battocletti J. H.: NMR proton imaging, CRC Crit. Rev. Biomed. Eng. vol. 11, pp. 313-356, 1984, Mansfield P. and Morris P. G.: NMR imaging in biomedicine, Adv. in magnetic resonance, Academic Press, New York 1982, Abragam A.: The principles of nuclear magnetism, Clarendon Press, Oxford 1961, Lasker S. E. and Milvy P. (eds.): Electron spin resonance and nuclear magnetic resonance in biology and medicine and magnetic resonance in biological systems, Annals of New York Academy of Sciences vol. 222, New York Academy of Sciences, New York 1973, Sepponen R. E.: Discrimination and characterization of biological tissues with magnetic resonance imaging: A study on methods for T1, T2, T1rho and chemical shift imaging, Acta polytechnica scandinavica EL-56, Helsinki 1986, Fukushima E. and Roeder S. B.: Experimental pulse NMR, Addison Wesley, London 1981, Thomas S. R. and Dixon R. L. (eds.) NMR in medicine: The instrumentation and clinical applications, Medical Physics Monograph No. 14, American Institute of Physics, New York 1986, Anderson W. A. et al: U.S. Pat. No. 3,475,680, Ernst R. R.: U.S. Pat. No. 3,501,691, Tomlinson B. L. et al: U.S. Pat. No. 4,034,191, Ernst R. R.: U.S. Pat. No. 3,873,909, Ernst R. R.: U.S. Pat. No. 4,070,611, Bertrand R. D. et al: U.S. Pat. No. 4,345,207, Young I. R.: U.S. Pat. No. 4,563,647, Hofer D. C. et al: U.S. Pat. No. 4,110,681, Savolainen M. K.: Magnetic resonance imaging at 0.02 T: Design and evaluation of radio frequency coils with wave winding, Acta Polytechnica Scandinavica Ph 158, Helsinki 1988, Sepponen R. E.: U.S. Pat. No. 4,743,850, Sepponen R. E.: U.S. Pat. No. 4,654,595, Savolainen M. K.: U.S. Pat. No. 4,712,068, Sepponen R. E.: U.S. Pat. No. 4,587,493, Savolainen M. K.: U.S. Pat. No. 4,644,281 and Kupiainen J.: U.S. Pat. No. 4,668,904.

Most often, the medical imaging utilizes the magnetic resonance of a hydrogen nucleus since the hydrogen nucleus has a high magnetic moment and since its content in a biological tissue is high. Hereinafter we shall follow the practice adopted in literature, wherein the hydrogen nucleus is referred to as a proton and the nuclei being examined are generally referred to as spin nuclei.

According to the prior art and referring to FIG. 1, an object P to be examined is placed in a magnetic field $B_o$ as homogeneous as possible (so-called polarizing magnetic field), the apparatus further including a signal coil C for detecting an NMR signal, said coil being connected to an NMR spectrometer L, the apparatus being provided, for coding positional information, with a gradient coil arrangement G, the current required thereby being supplied by gradient current sources GC controlled by the spectrometer.

It is prior known to subject an object being examined to a radio frequency radiation at a frequency different from that of nuclear magnetic resonance (off-resonance radiation) for thus saturating the magnetization of abundantly proteinaceous components. In the case of a biological tissue, the signal visible in magnetic resonance imaging most often originates from the protons of water or fat molecules. Typically, the transverse relaxation time T2 of this NMR signal is more than 30 ms. The relaxation time of a signal corresponding to the protons contained in proteins is less than 0,5 ms—too short for the proteins to be directly visible in typical magnetic resonance imaging. By applying the radiation different from the resonance frequency of the protons included in the water and fat molecules of a tissue it is possible to saturate the nuclear magnetization of the protons of said proteins without having a direct effect on the nuclear magnetization of the protons of fat and water.

Between the protons contained in proteins and the protons contained in water molecules there is a continuous interaction. Thus, saturation of the protons included in proteins has an effect on the nuclear magnetization of water molecules through a so-called magnetization transfer (MT) penomenon. This phenomenon can be utilized for studying interactions between the proteins, fat and water of tissues and to achieve in magnetic resonance imaging an improved contrast between different tissues. The magnetization transfer phenomenon has been described e.g. in reference S. D. Wolff and R. S. Balaban: Magnetic Resonance in Medicine, 10, 135-144 (1989).

The above-mentioned saturation phenomenon should not be mistaken for a so-called radiofrequency bleed). This phenomenon refers to the direct effect of off-resonance radiation on an object whose longitudinal relaxation time is T1 and transverse relaxation time T2:

$$Mf = MO*(1 + T2^2 * w^2)/(1 + T2^2 * w^2 + (96 B1)^2 * T1 * T2), \quad (1)$$

wherein Mf is magnetization after radiation, MO is the value of equilibrium magnetization, $w/(2\pi)$ is a difference frequency between radiation frequency and proper resonance frequency, B1 is the amplitude of a radiated alternating magnetic field and $\tau$ is the so-called gyromagnetic ratio of a nucleus being examined. A presumption in formula (1) is that radiation time is of the same order as longitudinal relaxation time T1. Generally, in magnetization transfer test conditions the difference frequency is selected in a manner that the direct effect of radiation, as indicated in formula 1, is minor if compared to the indirect effect occurring through proteins.

Inversion recovery (IR) is one of the techniques applied in magnetic resonance imaging. As shown in FIG. 2, the technique or method comprises an inversion pulse (IP) or some other similar action for producing inversion (e.g. adibatic rapid by-pass, composite pulses), the magnetization vector being turned 180°, a recovery time TI, the magnetization recovering towards its balanced value, as well as the actual imaging, the contrast of an image obtained depending on the degree the magnetization has had time to recover within the period of TI.

The recovery of magnetization can be described with a time constant T1 (longitudinal relaxation time):

$$M = M_o (1 - 2 \exp(-TI/T1) + \exp(-TR/T1)), \qquad (2)$$

wherein M is the magnitude of magnetization after time TI has lapsed from inversion pulse, $M_o$ is a magnetization corresponding to equilibrium, and TR is the interval for repeated measurements. Relaxation time T1 depends on the chemical and physical properties of an object (e.g. various types of tissue) being imaged. In certain cases, the recovery of magnetization cannot be very well demonstrated by means of a single relaxation time, but even then the main features of the phenomenon can be described by means of a more simple formula 2. What is particularly essential in inversion recovery sequence is that with a certain selection of inversion time the magnetization of a sample possessing a certain T1 and hence also the obtained NMR signal is zero.

In medical imaging the above principle has ben exploited: the inversion time is selected in a manner that a certain type of tissue produces a zero signal, the tissue contrast between this and other tissues being significant. In normal imaging, however, it is not important whether some signal is exactly zero but the only significant point is the absolute intensity difference in relation to noise.

One interesting group of magnetic resonance imaging methods is associated with magnetic resonance angiography (MR angiography). An object in these methods is to maximize the contrast of blood vessels in relation to other tissues. If the contrast is sufficient, it is possible to apply a so-called projection method with the entire object being excited at the same time. Thus, the entire blood vessel system of an object is visible as an image similar to X-ray angiography.

The above-described MR angiography and the like projection techniques require that a signal emitted from other types of tissue than that of interest be nearly zero. In most cases, such a contrast can only be achieved by a combination of two or more images. For example, MR angiography can be carried out by first taking an image with moving spin nuclei issuing just a small signal and then an image with flowing spin nuclei putting out a normal signal. This is possible by means of a so-called GMN method or similar methods (see e.g. the reference C. E. Spritzer, R. A. Blinder: Magnetic Resonance Quarterly, 5, 205-227 (1989)). In the differential image of these two images the stationary spin nuclei disappear and only moving spins remain (e.g. blood flowing in blood vessels). Another possibility is to take an image before and after the injection of a contrast medium. The properties of blood change through the action of a contrast medium while other tissues generally remain unchanged. Thus, all that is visible in the differential image is the blood vessel system.

Two separate images involve certain problems. The movement of an object (e.g. a patient) can ruin the end result. The dynamics required of the entire system are enormous since, generally, a signal emitted by a tissue being examined is just a fraction of the entire signal.

Thus, it would often be desirable to create a situation in which the original signal would only originate from certain or certain desired types of tissue. The inversion recovery sequence is one way of reducing a signal originating from certain selected types of tissue even to zero. A problem is, however, that biological objects are most often complicated structures having a great variety of different relaxation times. It is not generally possible to select the inversion time TI in a manner that there is a zero signal coming from all other types of tissue except one particular type.

In addition to MR angiography, the above aspect applies in MR myelography which strives to clarify the distribution of cerebrospinal fluid in an object.

One application of magnetic resonance imaging is so-called perfusion sensitive imaging for visualizing microcirculatory phenomena. The widely applied method is based on the use of large so-called perfusion gradients. These gradients are on after the excitation pulse prior to signal collection and their amplitude and duration are selected in a manner that their effect on stationary spin nuclei is zero but on moving spin nuclei other than zero. The end result image is used to examine the variations in the amplitude or phase of a signal.

SUMMARY OF THE INVENTION

In the present invention, the inversion recovery sequence is modified for creating more freedom than in the prior art to have an effect on the contrasts between various tissues. The method comprises a preparatory section with procedures for producing an inversion and procedures for off-resonance radiation, as well as an imaging section for using prior known magnetic resonance imaging methods to effect positional coding which facilitates the calculation of a magnetic image.

BRIEF DESCRIPTION OF THE DRAWINGS

The invention is illustrated in the accompanying drawings, in which

FIG. 5 shows a contrast between different tissues provided by a normal inversion recovery sequence, FIG. 6 illustrates the effect of a sequence as shown in FIG. 3 on a tissue contrast.

DETAILED DESCRIPTION OF THE PREFERRED EMBODIMENTS

Figure 1:
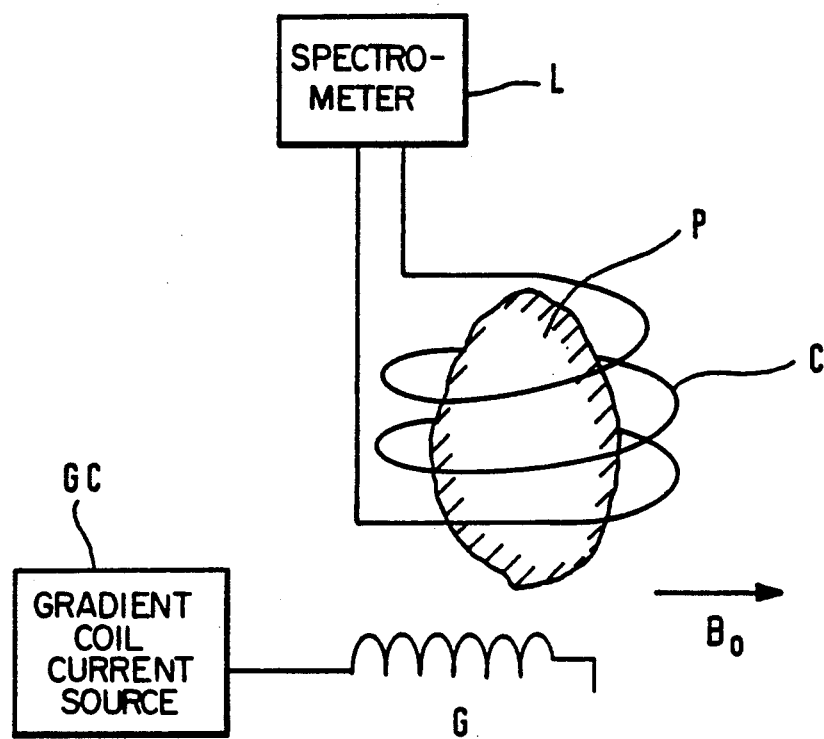
FIG. 1 shows apparatus for carrying out NMR examination of an object.
Figure 2:
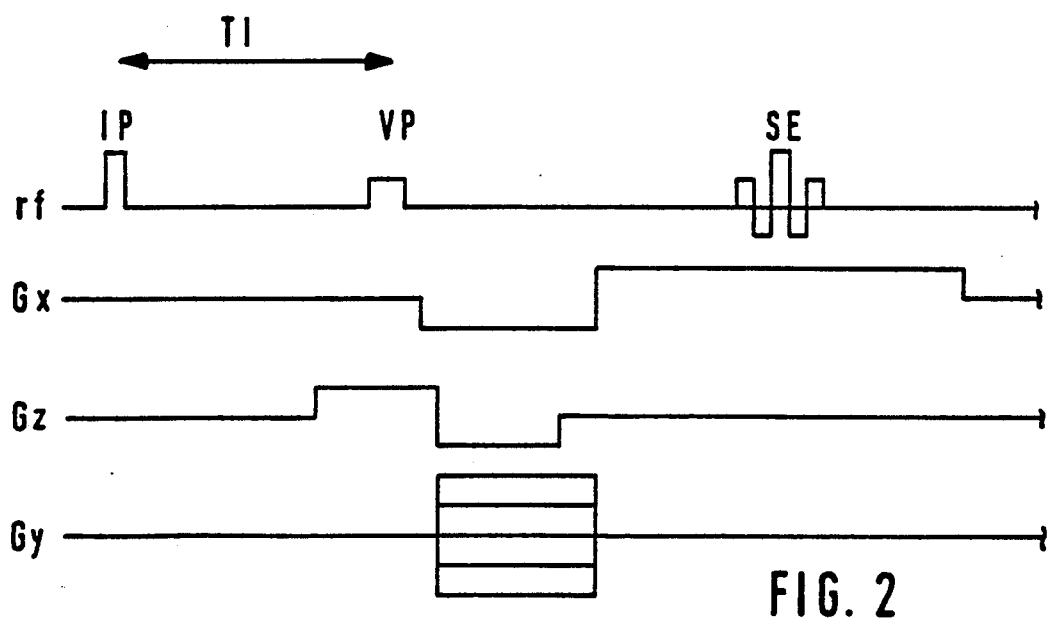
FIG. 2 shows an inversion recovery technique applied in magnetic resonance imaging.
Figure 3:
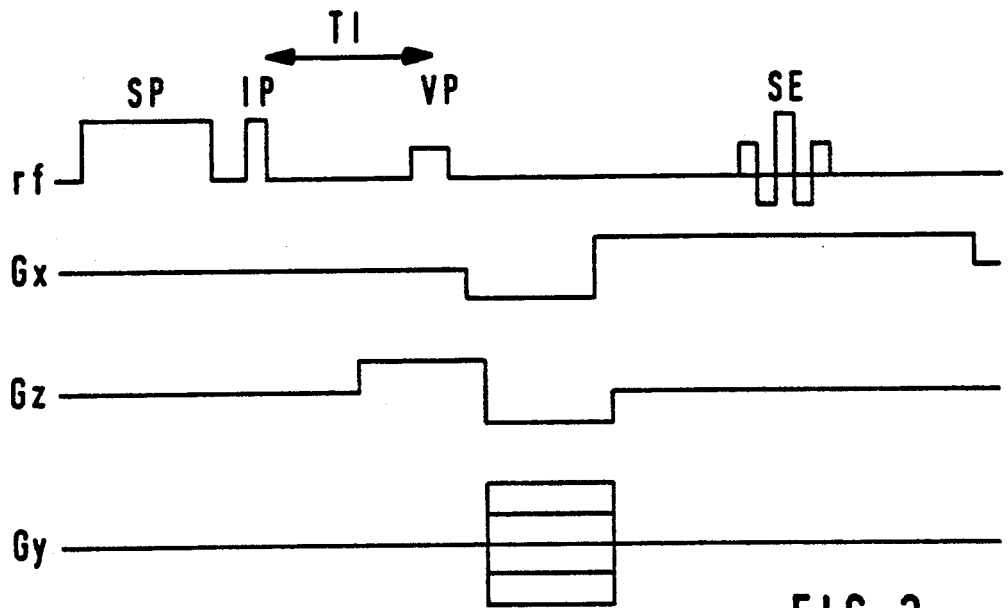
FIG. 3 shows one imaging sequence according to the invention.

FIG. 3 illustrates one pulse sequence according to the invention. Prior to the normal inversion recovery sequence, a sample is exposed to off-resonance radiation (SP). This is followed by effecting a normal inversion recovery sequence: inversion pulse IP turns the magnetization appr. 180°, during inversion time TI the magnetization recovers towards its equilibrium value, excitation pulse VP then turns the partially recovered magnetization through a desired angle. In the figure, a signal, a so-called spin echo (SE), is produced by means of a so-called gradient conversion. Another possibility is to utilize a so-called pulse echo. Axes $G_x$, $G_y$, $G_z$ describe the gradient operations required for reaching positional resolution.

Figure 4:
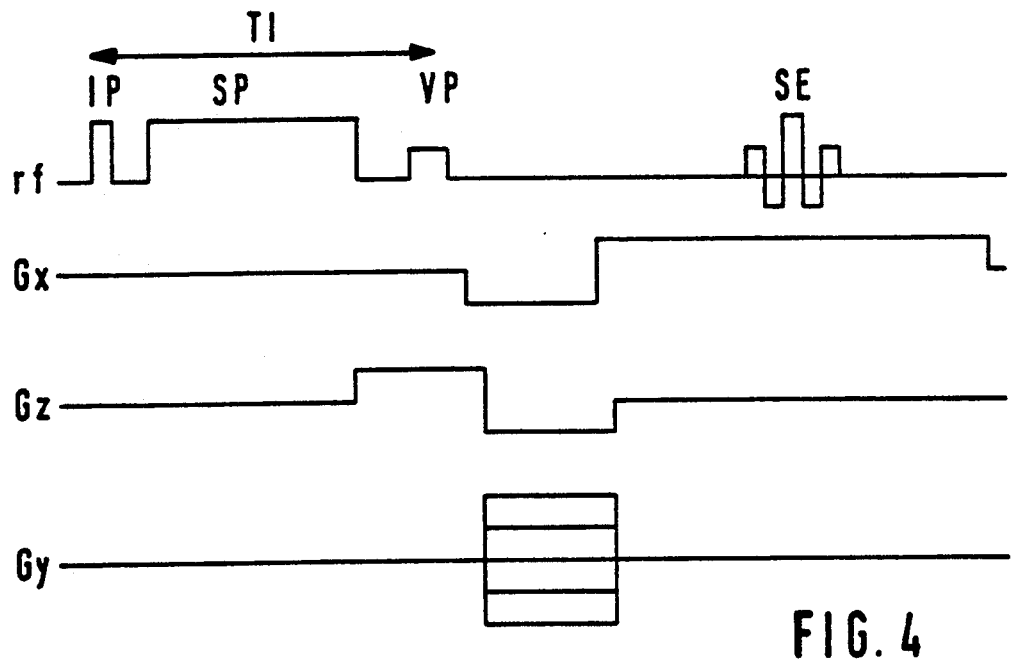
FIG. 4 shows one alternative imaging sequence according to the invention.

FIG. 4 illustrates one alternative pulse sequence according to the invention. In this sequence, the off-resonance radiation (SP) is effected between inversion pulse (IP) and excitation pulse (VP) during the course of inversion time TI. Otherwise the method is similar to that shown in FIG. 3.

One variation of the invention is a combination of FIGS. 3 and 4, wherein a sample is subjected to off-resonance radiation both prior to the inversion pulse and during the period between the inversion pulse and the excitation pulse.

FIG. 5 illustrates the dependence of the contrast of a normal inversion recovery sequence upon inversion time TI. In this and in the following figures, the zero level is indicated by a dash line. The showing includes three different types of tissue: a fat tissue with a relatively short longitudinal relaxation time T1 but a very low protein content, a muscular tissue also with a rather short longitudinal relaxation time T1 and a rich protein content, and blood with a long transverse relaxation time T1 and a rather low protein content. It can be appreciated that, in this case, it is not possible to achieve a situation in which, for example, the fat and muscular tissue would issue a zero signal but blood a signal different from zero.

In FIG. 6, a tissue contrast provided by the sequence shown in FIG. 3 is illustrated in more detail by using the above-mentioned exemplary tissues. The off-resonance radiation effected prior to an inversion pulse has no effect on the magnetization of hydrogen nuclei contained in fat molecules and a very little effect on the magnetization of water molecules contained in blood. On the other hand, the magnetization of abundantly proteinaceous muscular tissue is distinctively shortened. If the parameters (amplitude, duration and frequency of radiation) associated with off-resonance radiation are properly selected, the result will be a situation as shown in the figure: signals corresponding to fat and muscular tissues disappear when value $t_0$ is selected for inversion time TI.

Figure 7:
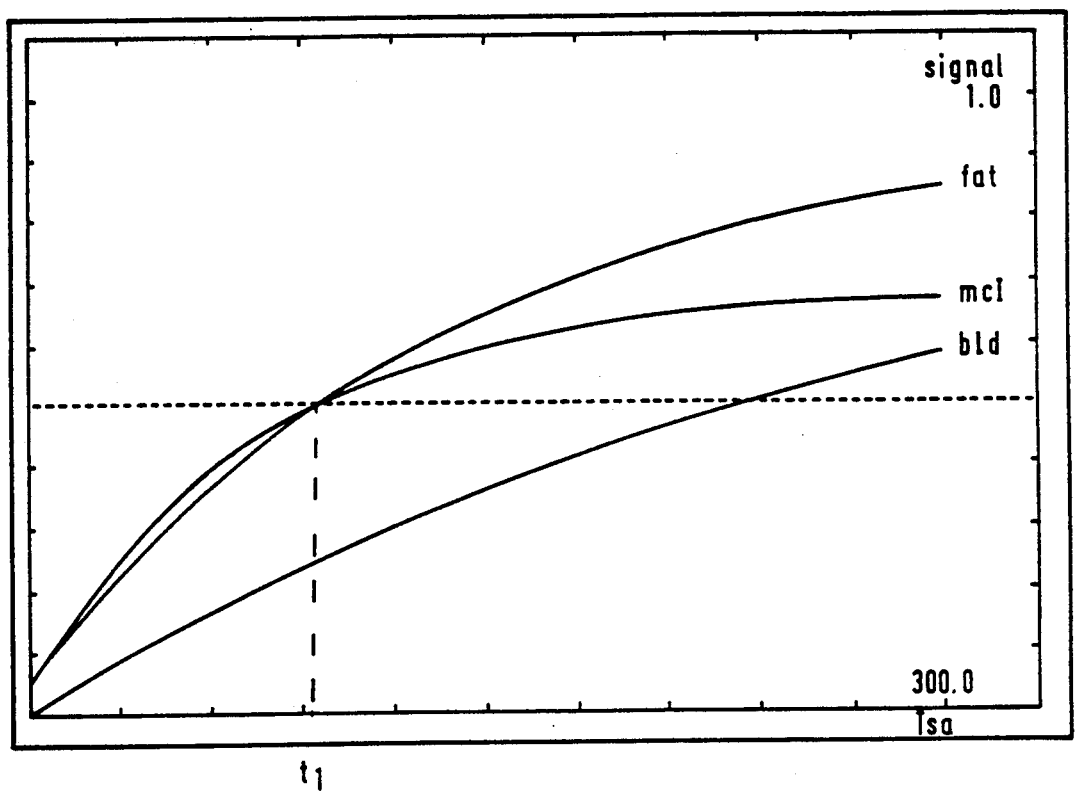
FIG. 7 illustrates the effect of a sequence as shown in FIG. 4 on tissue contrast.

In FIG. 7, a tissue contrast provided by the sequence shown in FIG. 4 is illustrated in more detail by using the above-mentioned exemplary tissues. Prior to an inversion pulse, the magnetizations are now in the state of equilibrium. After an inversion pulse, the off-resonance saturation has different effects on signals corresponding to different tissues: radiation has no effect on fat tissue, only a slight effect on the signal of blood, but the muscular longitudinal relaxation time T1 during the course of radiation is significantly shortened. The proper selection of parameters associated with a radiation pulse produces a situation as shown in the figure: signals corresponding to fat and muscular tissues disappear when value $T_1$ is selected for inversion time TI.

The action upon a contrast as shown in FIGS. 6-7 can also be effected by a direct radiofrequency leak (see formula 1), whereby the degree of variation in magnetization depends on relaxation times T1 and T2 of a sample. Radiofrequency bleed and magnetization transfer can also have a simultaneous effect to provide the method with more degrees of freedom.

The methods shown in FIGS. 3 and 4 can be varied by converting the trailing section of an imaging sequence into a pulse echo whereby it is possible to employ a long echo time and, thus, to further increase a tissue contrast by means of the differences in relaxation times T2.

In addition, the above-described methods of the invention can be modified by effecting the positional coding with gradients included in a GMN method.

The above-described methods of the invention can be modified by including perfusion gradients in the imaging sequence.

I claim:

1. A method for NMR examination of an object, said object having components of differing longitudinal relaxation time T1 and protein content contained therein, said object being subjected to a polarizing magnetic field for establishing a magnetization vector of spin nuclei contained in the object, there being an NMR frequency corresponding to the strength of the polarizing magnetic field to which the object is subjected, said method comprising the following steps carried out in a selected sequence:

applying an electromagnetic energy inversion pulse (IP) to the object for inverting the magnetization vector of the spin nuclei, the magnetization vector thereafter recovering toward an equilibrium condition during an inversion time period (TI);

applying electromagnetic radiation to the object having a frequency different from the NMR frequency for saturating the magnetization of one or more components in the object;

applying an electromagnetic energy NMR excitation pulse (VP) to the object following initiation of the inversion time period; and obtaining NMR signal data from the object, the duration of the inversion time period and the duration, amplitude, and frequency of the electromagnetic radiation being selected such as to differentially alter the signal data obtained rom at least one component in the object with respect to signal data obtained form at least one other component in the object.

2. A method as set forth in claim 1 wherein the step of applying electromagnetic radiation precedes the step of applying an inversion pulse.

3. A method as set forth in claim 1 wherein the step of applying an inversion pulse precedes the step of applying electromagnetic radiation.

4. A method as set forth in claim 2 including the further step of applying electromagnetic radiation to the object having a frequency different from the NMR frequency following the step of applying an inversion pulse.

5. A method as set forth in claim 1 wherein the step of applying the excitation pulse is further defined as applying the excitation pulse to the entire object.

6. A method as set forth in claim 2 wherein the step of applying the excitation pulse is further defined as applying the excitation pulse to the entire object.

7. A method as set forth in claim 3 wherein the step of applying the excitation pulse is further defined as applying the excitation pulse to the entire object.

8. A method as set forth in claim 4 wherein the step of applying the excitation pulse is further defined as applying the excitation pulse to the entire object.

9. A method as set forth in claim 1 wherein the object contains fat tissue and tissue having an abundance of protein and wherein said method is further defined as selecting the duration of the inversion time period so that the signal data from the fat tissue is at a minimum level and as selecting the parameters of the electromagnetic radiation so that the signal data from tissue having an abundance of protein is as low as possible with respect to the minimum level.

10. A method as set forth in claim 1 wherein the object has stationary spin nuclei and moving spin nuclei, wherein the NMR signal data is obtained by means of a spin echo, and wherein the method includes the step of applying at least one magnetic field gradient to the object subsequent to the application of the excitation pulse and prior to the appearance of the spin echo, the magnetic field gradients having a greater effect on the moving spin nuclei than on the stationary spin nuclei.

* * * * *